(12) United States Patent
Chen et al.

(10) Patent No.: US 10,541,249 B2
(45) Date of Patent: Jan. 21, 2020

(54) THREE-DIMENSIONAL MEMORY DEVICES AND FABRICATING METHODS THEREOF

(71) Applicant: Yangtze Memory Technologies Co., Ltd., Wuhan, Hubei (CN)

(72) Inventors: Ziqi Chen, Hubei (CN); Guanping Wu, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/126,425

(22) Filed: Sep. 10, 2018

(65) Prior Publication Data

US 2019/0123054 A1 Apr. 25, 2019

Related U.S. Application Data

(63) Continuation of application No. PCT/CN2018/097723, filed on Jul. 30, 2018.

(30) Foreign Application Priority Data

Aug. 31, 2017 (CN) .......................... 2017 1 0772349

(51) Int. Cl.
*H01L 27/1157* (2017.01)
*H01L 27/11524* (2017.01)
(Continued)

(52) U.S. Cl.
CPC .... *H01L 27/1157* (2013.01); *H01L 21/76805* (2013.01); *H01L 21/76816* (2013.01);
(Continued)

(58) Field of Classification Search
CPC ........... H01L 27/1157; H01L 29/40117; H01L 29/40114; H01L 27/11582; H01L 23/535;
(Continued)

(56) References Cited

U.S. PATENT DOCUMENTS

| 8,115,259 B2 | 2/2012 | Shim et al. |
| 8,349,689 B2 * | 1/2013 | Lee .................. H01L 27/11578 257/E21.41 |

(Continued)

FOREIGN PATENT DOCUMENTS

| CN | 101794789 A | 8/2010 |
| CN | 102263108 A | 11/2011 |

(Continued)

OTHER PUBLICATIONS

International Search Report and Written Opinion of the International Searching Authority directed to related international Patent Application No. PCT/CN2018/097723, dated Oct. 31, 2018; 7 pages.

*Primary Examiner* — Syed I Gheyas
(74) *Attorney, Agent, or Firm* — Sterne, Kessler, Goldstein & Fox P.L.L.C.

(57) ABSTRACT

A method for forming a 3D memory device is disclosed. The method includes: forming an alternating dielectric stack including multiple first dielectric layers and second dielectric layers on a substrate; forming a channel hole penetrating the alternating dielectric stack, a first diameter of a lower portion of the channel hole being smaller than a second diameter of an upper portion of the channel hole; forming a channel structure including a functional layer in the channel hole, the functional layer including a storage layer; forming an electrode plug in the upper portion of the channel hole; replacing the storage layer in the functional layer in the upper portion of the channel hole with a second insulating layer; and replacing the second dielectric layers in the alternating dielectric stack with conductive layers.

20 Claims, 17 Drawing Sheets

(51) Int. Cl.
*H01L 27/11556* (2017.01)
*H01L 27/11582* (2017.01)
*H01L 21/768* (2006.01)
*H01L 23/528* (2006.01)
*H01L 23/522* (2006.01)
*H01L 23/535* (2006.01)
*H01L 21/28* (2006.01)

(52) U.S. Cl.
CPC .. *H01L 21/76859* (2013.01); *H01L 21/76877* (2013.01); *H01L 21/76895* (2013.01); *H01L 23/5226* (2013.01); *H01L 23/5283* (2013.01); *H01L 23/535* (2013.01); *H01L 27/11524* (2013.01); *H01L 27/11556* (2013.01); *H01L 27/11582* (2013.01); *H01L 29/40114* (2019.08); *H01L 29/40117* (2019.08)

(58) Field of Classification Search
CPC ......... H01L 21/76816; H01L 21/76895; H01L 21/76859; H01L 21/76805; H01L 23/5226; H01L 23/5283; H01L 21/76877; H01L 27/11556; H01L 27/11524; H01L 27/11578; H01L 27/11575
See application file for complete search history.

(56) References Cited

U.S. PATENT DOCUMENTS

| | | | |
|---|---|---|---|
| 8,717,814 B2* | 5/2014 | Choi | H01L 27/11565 365/185.05 |
| 8,923,072 B2 | 12/2014 | Oh | |
| 9,252,148 B2 | 2/2016 | Hasegawa et al. | |
| 2009/0003068 A1 | 1/2009 | Lee et al. | |
| 2011/0189853 A1* | 8/2011 | Kito | G11C 16/10 438/675 |
| 2011/0199833 A1* | 8/2011 | Shim | G11C 16/0483 365/185.23 |
| 2012/0081958 A1* | 4/2012 | Lee | G11C 16/0483 365/185.05 |
| 2013/0056814 A1* | 3/2013 | Higuchi | H01L 27/1157 257/314 |
| 2014/0306353 A1 | 10/2014 | Jang | |
| 2016/0118398 A1* | 4/2016 | Yon | H01L 27/11582 257/314 |
| 2017/0125430 A1 | 5/2017 | Nishikawa et al. | |
| 2019/0043883 A1 | 2/2019 | Xu et al. | |
| 2019/0123054 A1 | 4/2019 | Chen et al. | |

FOREIGN PATENT DOCUMENTS

| | | |
|---|---|---|
| CN | 103066076 A | 4/2013 |
| CN | 103872057 A | 6/2014 |
| CN | 106104693 A | 11/2016 |
| CN | 106409768 A | 2/2017 |
| CN | 106876397 A | 6/2017 |
| CN | 107527918 A | 12/2017 |
| WO | WO-207/181945 A1 | 10/2017 |

* cited by examiner

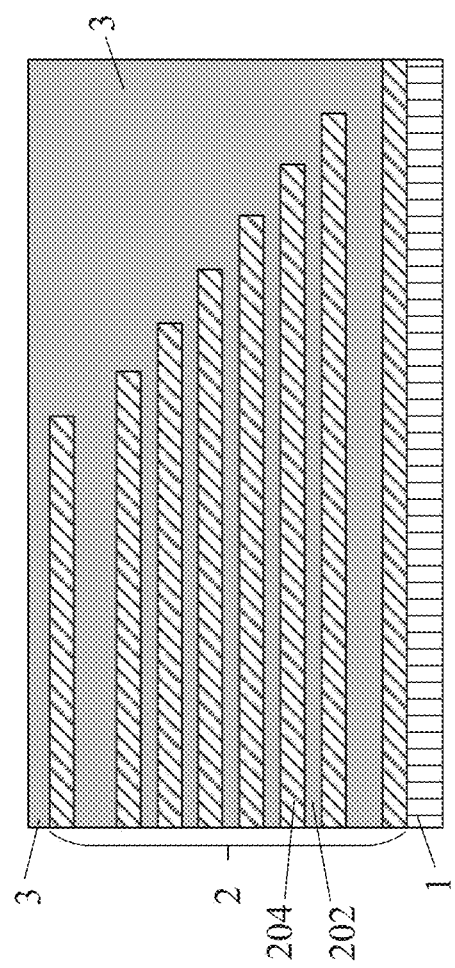

THREE-DIMENSIONAL MEMORY DEVICES AND FABRICATING METHODS THEREOF

CROSS-REFERENCE TO RELATED APPLICATIONS

This application claims priority to PCT/CN2018/097723 filed on Jul. 30, 2018, which claims priority to Chinese Patent Application No. 201710772349.0, filed on Aug. 31, 2017, the entire contents of which are incorporated herein by reference.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, source selective gates are located at bottom of alternating layer stack, and drain selective gates are located at top of the alternating layer stack. A gate oxide layer of the drain selective gates generally includes a silicon nitride layer as a charge trap layer. Thus, in operations of the existing 3D NAND memory devices, the drain selective gates inevitably storage and release charges, which can easily cause a threshold voltage drift, resulting a current change or even a current leakage in the vertical channels. The problems may get worse after multiple repeated reading and writing operations, and eventually cause a read failure of the existing 3D NAND memory devices.

BRIEF SUMMARY

Embodiments of a method for forming a three-dimensional (3D) memory devices are disclosed herein.

One aspect of the present disclosure provides a method for forming a three-dimensional (3D) memory device, comprising: forming an alternating dielectric stack and a first insulating layer on a substrate, the alternating dielectric stack including a plurality of first dielectric layers and second dielectric layers; forming a channel hole penetrating the first insulating layer and the alternating dielectric stack, a first diameter of a lower portion of the channel hole being smaller than a second diameter of an upper portion of the channel hole; forming a channel structure including a functional layer in the channel hole, the functional layer including a storage layer; forming an electrode plug in the upper portion of the channel hole; replacing the storage layer in the functional layer in the upper portion of the channel hole with a second insulating layer; and replacing the plurality of second dielectric layers in the alternating dielectric stack with a plurality of conductive layers.

In some embodiments, forming the alternating dielectric stack comprises: forming at least 32 dielectric layer pairs stacked in a vertical direction, wherein each dielectric layer pair includes one first dielectric layer and one second dielectric layer that is different from the first dielectric layer.

In some embodiments, forming the alternating dielectric stack comprises: forming at least 32 dielectric layer pairs stacked in the vertical direction, wherein each dielectric layer pair includes a silicon oxide layer and a silicon nitride layer.

In some embodiments, forming the channel hole comprises: forming the channel hole penetrating the first insulating layer and the alternating dielectric stack, the channel hole having the first diameter; and enlarging the upper portion of the channel hole, such that the upper portion of the channel hole has the second diameter. A difference between the second diameter and the first diameter is larger than a thickness of the functional layer.

In some embodiments, enlarging the upper portion of the channel hole comprises: adjusting an opening of a hard mask layer; and etching the alternating dielectric stack based on the opening to enlarge the upper portion of the channel hole. The upper portion of the channel hole at least includes a top second dielectric layer and a portion of a top first dielectric layer of the alternating dielectric stack.

In some embodiments, forming the channel structure comprises: forming an epitaxial layer on a bottom of the channel hole; forming the functional layer on a sidewall of the channel hole and on a platform at a boundary between the upper portion and the lower portion of the channel hole; forming a channel layer covering the functional layer, the channel layer being in contact with the epitaxial layer; and forming a filling structure covering a sidewall of the channel layer and filling the channel hole.

In some embodiments, forming the functional layer comprises: forming a barrier layer on the sidewall of the channel hole to block an outflow of electronic charges; forming the storage layer on a surface of the first barrier layer to store electronic charges during operation of the 3D memory device; and forming a tunneling layer on a surface of the storage layer to tunnel electronic charges.

In some embodiments, forming the channel layer comprises: forming a first channel layer covering the functional layer; removing a portion of the first channel and the functional layer to expose a surface of the epitaxial layer, and to separate the functional layer in the lower portion of the channel hole with the functional layer in the upper portion of the channel hole; and forming a second channel layer covering the first channel layer and the exposed surface of the epitaxial layer.

In some embodiments, forming the electrode plug comprises: removing an upper portion of the filling structure to form a recess in the upper portion of the first channel hole; forming the electrode plug in the recess; and performing an implantation process to the electrode plug.

In some embodiments, replacing the storage layer in the functional layer in the upper portion of the channel hole with the second insulating layer comprises: removing the storage layer of the functional layer in the upper portion of the channel hole to form a hollow space between the barrier layer and the tunneling layer of the functional layer in the upper portion of channel hole; and depositing an insulating material to fill the hollow space.

In some embodiments, replacing the plurality of second dielectric layers in the alternating dielectric stack with the plurality of conductive layers comprises: removing the plurality of second dielectric layers in the alternating dielectric stack to form a plurality of trenches; and depositing a conductive material to fill the plurality of trenches to form the plurality of conductive layers.

In some embodiments, the method further comprises forming a staircase structure in the alternating dielectric stack, wherein the first insulating layer covers the staircase structure.

Another aspect of the present disclosure provides a three-dimensional (3D) memory device, comprising: an alternating layer stack on a substrate; a first insulating layer covering the alternating layer stack; a channel hole penetrating the first insulating layer and the alternating layer stack, a first diameter of a lower portion of the channel hole being smaller than a second diameter of an upper portion of the channel hole; a channel structure including a functional layer in the lower portion of the channel hole; and a top selective gate structure above the lower portion of the channel hole, including: an electrode plug in the upper portion of the channel hole, and a second insulating layer between the electrode plug and a top conductive layer of the alternating layer stack.

In some embodiments, the top selective gate structure is a metal-oxide-semiconductor transistor configured to function as a drain selective transistor.

In some embodiments, the alternating layer stack comprises at least 32 conductive/dielectric layer pairs stacked in a vertical direction, wherein each conductive/dielectric pair includes a dielectric layer and a conductive layer. In some embodiments, the alternating layer stack comprises at least 32 conductive/dielectric layer pairs stacked in a vertical direction, wherein each conductive/dielectric layer pair includes a silicon oxide layer and a tungsten layer.

In some embodiments, a difference between the second diameter and the first diameter is larger than a thickness of the functional layer.

In some embodiments, the channel structure comprises: an epitaxial layer on a bottom of the channel hole, a top surface of the epitaxial layer is higher than a top surface of a bottom conductive layer of the alternating layer stack; the functional layer on a sidewall of the lower portion of the channel hole; a channel layer covering the functional layer, the channel layer being in contact with the epitaxial layer; and a filling structure covering a sidewall of the channel layer and filling the channel hole.

In some embodiments, the functional layer comprises: a barrier layer on the sidewall of the lower portion of the channel hole configured to block an outflow of electronic charges; the storage layer on a surface of the barrier layer configured to store electronic charges during operation of the 3D memory device; and a tunneling layer on a surface of the storage layer configured to tunnel electronic charges.

In some embodiments, the device further comprises a staircase structure in the alternating dielectric stack. The first insulating layer covers the staircase structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
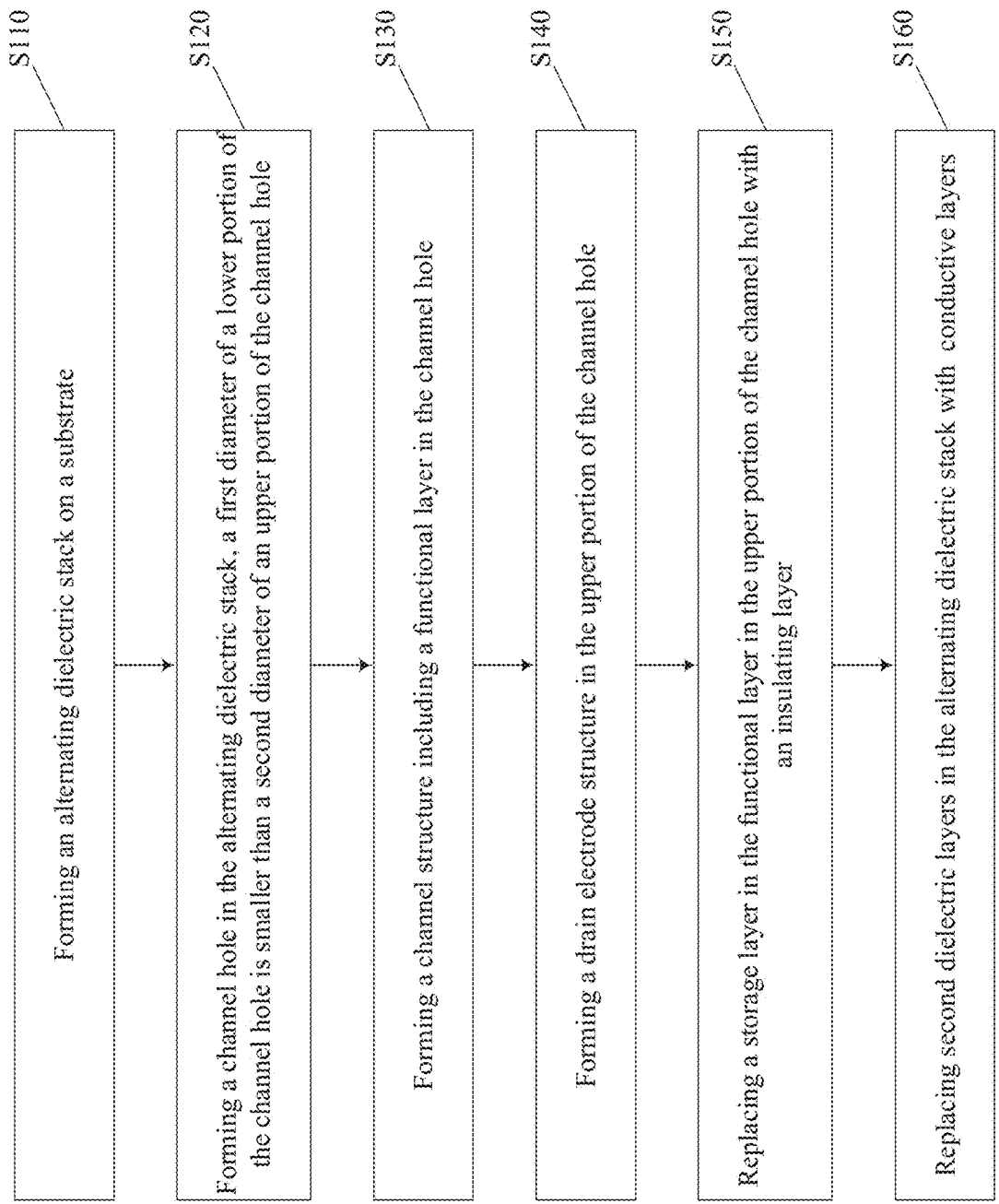
FIG. 1 illustrates a flow diagram of an exemplary method for forming a 3D memory device in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

As described above, in some existing 3D NAND memory devices, the source selective gates are located at the bottom of alternating layer stack, and the drain selective gates are located at the top of the alternating layer stack. A gate oxide layer of the drain selective gates generally includes a silicon nitride layer as a charge trap layer. Thus, in the operation of the existing 3D NAND memory devices, the drain selective gates inevitably storage and release charges, which can easily cause a threshold voltage drift, resulting a current change or even a current leakage in the vertical channels. The problems may get worse after multiple repeated reading and writing operations, and eventually cause a read failure of the existing 3D NAND memory devices.

Accordingly, in order to eliminate such drawbacks, various embodiments in accordance with the present disclosure provide a method for forming a 3D NAND memory device with a top selective gate structure for a memory array (also referred to herein as an "array device"). When forming the vertical memory cell strings, the charge trap layer (e.g., silicon nitride layer) corresponding to the top memory layer can be replaced with a silicon oxide layer. The silicon oxide layer can be used as a gate oxide layer, and does not affect the memory cell layers below the top memory layer. The top memory layer at the top of the vertical cell string can be used to form a metal-oxide-semiconductor (MOS) transistor. The MOS transistor can serve as a drain selective transistor for the 3D NAND memory device.

Comparing to the existing 3D NAND memory devices, the 3D NAND memory device formed by the disclosed method does not have a charge trap layer in the gate oxide layer in the drain selective gate. Thus, in the operation of the 3D NAND memory device, the drain selective gate does not store or release charges. Thus, the problem of vertical channel leakage can be eliminated, and thereby reducing the risk of memory read failure and prolonging the memory life. Moreover, using MOS transistors as the drain selective transistors can have better switching characteristics.

Referring to FIG. 1, a flow diagram of an exemplary method for forming a 3D memory device is shown in accordance with some embodiments of the present disclosure. FIGS. 2A-2P illustrate cross-sectional views of an exemplary 3D memory device at certain fabricating stages of the method shown in FIG. 1.

As shown in FIG. 1, the method can start at operation S110, in which an alternating dielectric stack can be formed on a substrate. A staircase structure can be formed on an edge of the alternating dielectric stack.

As shown in FIG. 2A, in some embodiments, substrate 1 can be any suitable semiconductor substrate having any suitable structure, such as a monocrystalline single-layer substrate, a polycrystalline silicon (polysilicon) single-layer substrate, a polysilicon and metal multi-layer substrate, etc.

Alternating dielectric stack 2 including a plurality of dielectric layer pairs can be formed on substrate 1. Alternating dielectric stack 2 can include an alternating stack of a first dielectric layer 202 (e.g., of silicon oxide) and a second dielectric layer 204 (e.g., of silicon nitride) that is different from first dielectric layer, for example. The plurality of first dielectric layers 202 and second dielectric layers 204 are extended in a lateral direction that is parallel to the surface of substrate 1. In some embodiments, there are more layers than the dielectric layer pairs made of different materials and with different thicknesses in alternating dielectric stack 2. Alternating dielectric stack 2 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, alternating dielectric stack 2 can include a plurality of oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in alternating dielectric stack 2, multiple oxide layers 202 (shown in the areas with dotes) and multiple nitride layers 204 (shown in the areas with meshes) alternate in a vertical direction. In other words, except a top and a bottom layer of a given alternating oxide/nitride stack, each of the other oxide layers 202 can be sandwiched by two adjacent nitride layers 204, and each of the other nitride layers 204 can be sandwiched by two adjacent oxide layers 202.

Oxide layers can each have the same thickness or have different thicknesses. For example, a thickness of each oxide layer can be in a range from 10 nm to 100 nm, preferably about 30 nm. Similarly, nitride layers can each have the same thickness or have different thicknesses. For example, a thickness of each nitride layer can be in a range from 10 nm to 100 nm, preferably about 35 nm. In some embodiments, a top oxide layer and a bottom oxide layer of alternating dielectric stack 2 can have a thickness larger than the thicknesses of other layers in alternating dielectric stack 2. The top oxide layer can be used as an isolation layer of the top selective gate (i.e., drain selective gate), while the bottom oxide layer can be used as an isolation layer of the bottom selective gate (i.e., source selective gate).

It is noted that, in the present disclosure, oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

Alternating dielectric stack 2 can include any suitable number of layers of oxide layers 202 and nitride layers 204. In some embodiments, a total number of layers of oxide layers 202 and nitride layers 204 in alternating dielectric stack 2 is equal to or larger than 64. That is, a number of oxide/nitride layer pairs can be equal to or larger than 32. In some embodiments, alternating oxide/nitride stack 2 includes more oxide layers or more nitride layers with different materials and/or thicknesses than the oxide/nitride layer pair.

In some embodiments, portions of alternating dielectric stack 2 can be removed to form a staircase structure at the edge of alternating dielectric stack 2. Multiple etch-trim processes can be performed repeatedly to form a set of steps. In some embodiments, each step can include one or more dielectric layer pairs. Each step can expose a portion of the top surface of one second dielectric layer 204. In some embodiments, the etch-trim processes can include a set of repeating etch-trim processes to form the staircase structure including a set of steps at the edge alternating dielectric stack 2.

Specifically, for forming each step, a photoresist layer (not shown) can be used as a mask to expose a portion of the top surface of alternating dielectric stack 2. For forming the first step, a width of the exposed top surface of alternating dielectric stack 2 can be a step width. In some embodiments, an anisotropic etching process, such as a reactive ion etching (RIE) process, or other suitable dry/wet etching process, can be performed to remove the exposed layer (e.g., second dielectric layer 204) that is exposed through the mask (i.e., the photoresist layer). The etching process can stop on the next lower layer (e.g., first dielectric layer 202). The pattern in the mask (i.e., the photoresist layer) is then transferred to the layer (e.g., second dielectric layer 204) that has been etched. The exposed next lower layers (e.g., first dielectric layers 202) can be then removed by another etching process that stops on the next lower layers (e.g., second dielectric layer 204). As such, the first step can be created on the first two top layers of alternating dielectric stack 2.

Next, the mask (i.e., the photoresist layer) can be reduced in size by removing a portion of the mask (also known as "trimming") above alternating dielectric stack 2, such as by an isotropic etching process, to expose another step width of alternating dielectric stack 2. The method can proceed by subjecting the structure to two anisotropic etching processes, including removing exposed portions of the two exposed layers (e.g., two second dielectric layers 204), and subsequently removing exposed portions of the two exposed next lower layers (e.g., first dielectric layers 202). As such, the first step can be lowered to the third and fourth top layers of alternating dielectric stack 2, and a second step can be created on the first two top layers of alternating dielectric stack 2.

In some embodiments, the successive reduction in size of the mask (i.e., the photoresist layer) and the two-step etching processes (also referred as etch-trim processes) can be repeated such that the staircase structure including a set of steps can be formed on the edge of alternating dielectric stack 2, as shown in FIG. 2A. The photoresist layer can be then removed. In some embodiments, the removal process can include any suitable etching processes and cleaning processes.

A first insulating layer 3 can be formed on alternating dielectric stack 2 to cover the top surface of alternating dielectric stack 2 and the staircase structure. In some embodiments, first insulating layer 3 can be made by any suitable insulating material and/or dielectric material, such as silicon oxide. It is noted that, the material of first insulating layer 3 can be different from the material of the nitride layer in alternating dielectric stack 2. First insulating layer 3 can be formed on the top surface of alternating dielectric stack 2. In some embodiments, first insulating layer 3 can be formed by using any suitable deposition process including, but not limited to, a chemical vapor deposition (CVD) process, a physical vapor deposition (PVD) process, an atomic layer deposition (ALD) process, etc.

Referring back to FIG. 1, the method can proceed to operation S120, in which a channel hole can be formed in the alternating dielectric stack. The channel hole can penetrate the alternating dielectric stack and the first insulating layer, and can include an upper portion and a lower portion. A first diameter of the lower portion of the channel hole can be smaller than a second diameter of the upper portion of the channel hole. A fabricating process to form the channel hole can include the following operations.

Figure 2B:
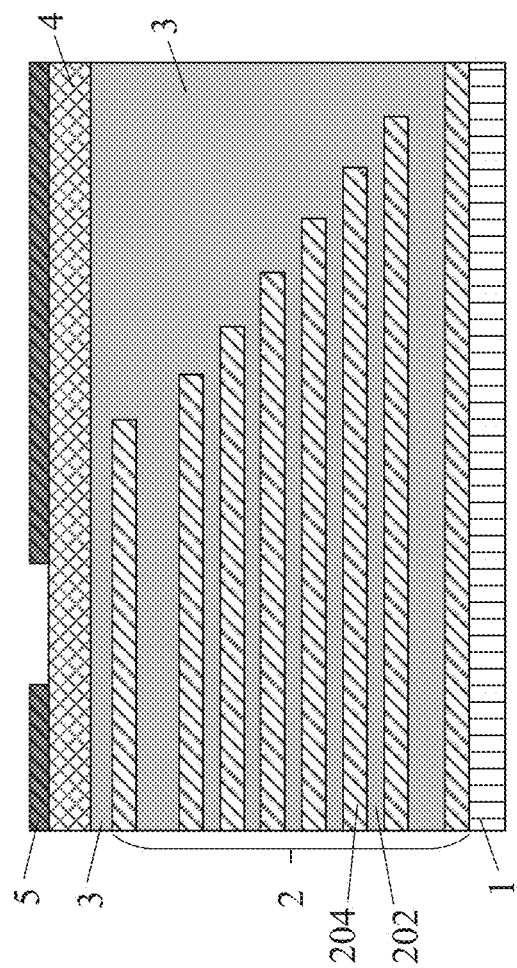
FIGS. 2A-2P illustrate cross-sectional views of an exemplary 3D memory device at certain fabricating stages of the method shown in FIG. 1.
Figure 2C:
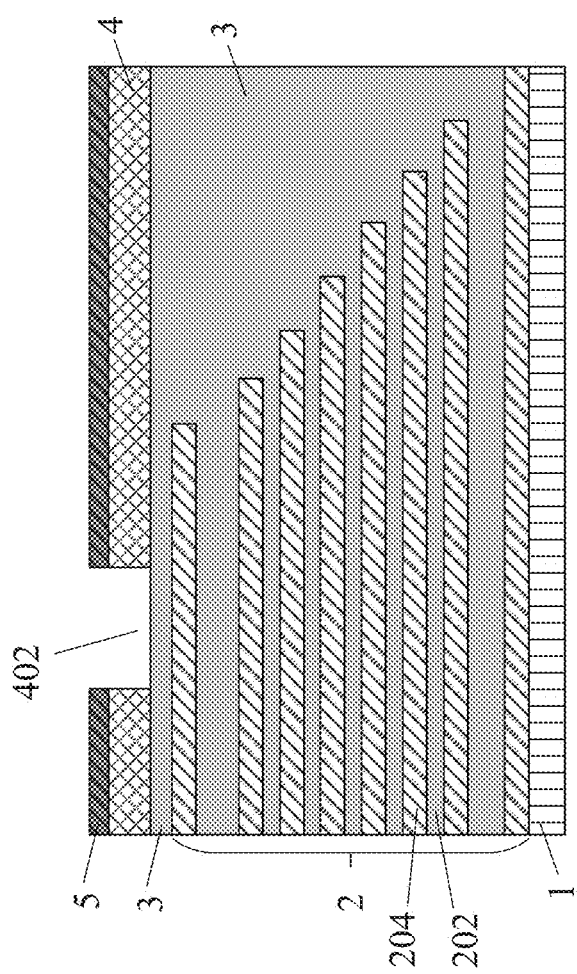

As shown in FIG. 2B, a hard mask layer 4 can be formed on the top surface of first insulating layer 3. Any suitable deposition process can be used to form hard mask layer 4. In some embodiments, hard mask layer 4 can be a silicon nitride layer. A patterned photoresist layer 5 can be formed on hard mask layer 4. Using the patterned photoresist layer 5 as a mask, a photolithography process can be performed to etch hard mask layer 4 to form an opening 402 in hard mask layer 4 to expose first insulating layer 3, as shown in FIG. 2C. It should be noted herein, a critical dimension (CD) of opening 402 can be determined based on various parameters, such as channel hole design pitch, channel hole layout, memory cell density, memory storage size, word line counts, positive or negative characteristic of photoresist, etc. In one example without limiting the scope of the present disclosure, if a positive photoresist layer 5 is used in the lithography process to etch the hard mask layer 4, a layer number of alternating dielectric stack 2 is 64, and the first diameter of the lower portion 604 of the channel hole 6 is designed to be in a range from about 50 nm to about 100 nm, the CD of opening 402 can be in a range from about 70 nm is about 120 nm.

Figure 2D:
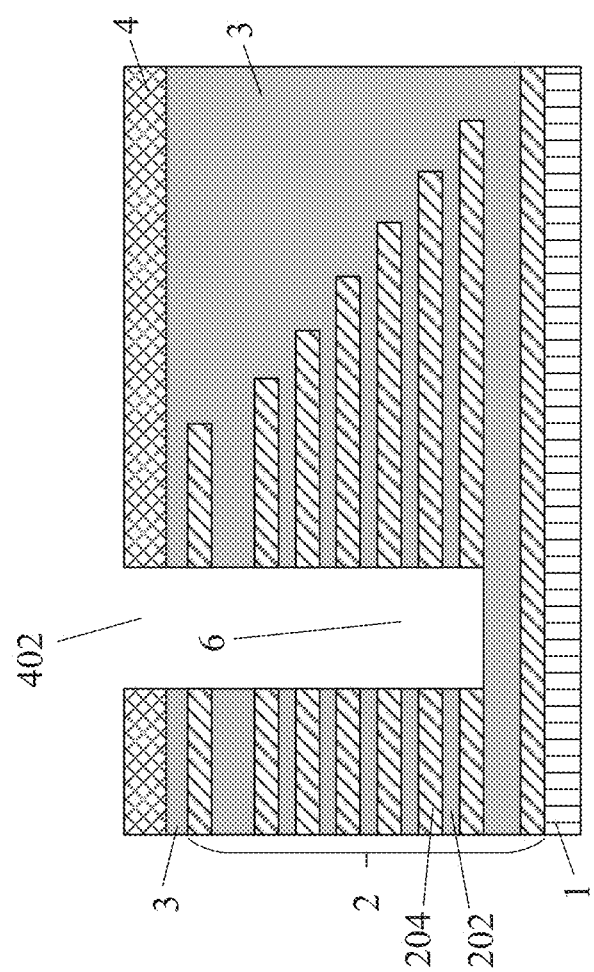

Based on the opening 402 in hard mask layer 4, a channel hole 6 having the first diameter can be formed in alternating dielectric stack 2, as shown in FIG. 2D. In some embodiments, channel hole 6 can penetrate first insulating layer 3 and multiple layers of alternating dielectric stack 2. A bottom of channel hole 6 can be the bottom first dielectric layer 202 or the bottom second dielectric layer 204. In some embodiments, the channel hole 5 can be formed by selectively etching alternating dielectric stack 2 and first insulating layer 3. The etching process to form the channel hole 5 can be an anisotropic dry etching, or a combination of a wet etching and a following cleaning process.

Figure 2E:
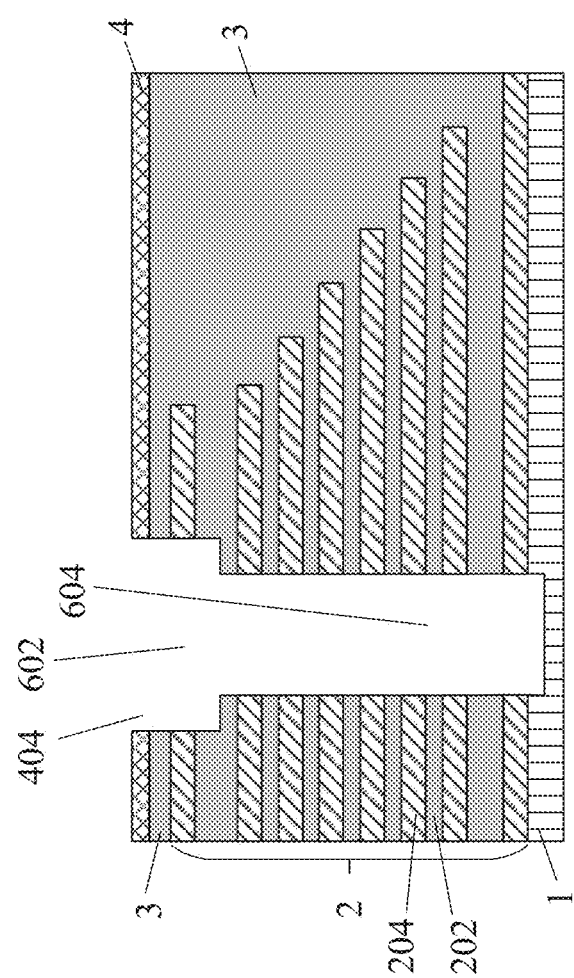

As shown in FIG. 2E, the diameter of opening 402 in hard mask layer 4 can be adjusted to form an enlarged opening 404. For example, an additional photolithography process can be performed to adjust the CD of opening 402 in hard mask layer 4 to form the enlarged opening 404. In some embodiments, a difference between the first diameter of the lower portion 604 of channel hole 6 and the second diameter of the upper portion 602 of channel hole 6 can be larger than a thickness of a functional layer formed in a subsequence process. For example, a difference between the first diameter and the second diameter is equal to or larger than 30 nm. As described above, the adjusted CD of enlarged opening 404 is also determined based on various parameters including at least channel hole design pitch, channel hole layout, memory cell density, memory storage size, word line counts, positive or negative characteristic of photoresist, etc. In one example without limiting the scope of the present disclosure, if a positive photoresist layer 5 is used, a layer number of alternating dielectric stack 2 is 64, and the second diameter of the upper portion 602 of channel hole 6 is designed to be in a range from about 80 nm to about 130 nm, the adjusted CD of enlarged opening 404 can be in a range from about 100 nm to about 150 nm.

Based on the enlarged opening 404 in hard mask layer 4, an upper portion 602 of channel hole 6 can be enlarged to have the second diameter. In some embodiments, as shown in FIG. 2E, the upper portion 602 of channel hole 6 includes at least one top second dielectric layer 204, and a portion of the top first dielectric layer that is the isolation layer of the top selective gate (e.g., drain selective gate). The upper portion 602 of channel hole 6 can be formed by selectively etching the top layers of alternating dielectric stack 2. In some embodiments, in the same etching process, the bottom first dielectric layer 202 and/or the bottom second dielectric layer 204 at the bottom of channel hole 6 can be penetrated. As such, the lower portion 604 of channel hole 6 can expose the surface of substrate 1 or extend into substrate 1.

Referring back to FIG. 1, the method can proceed to operation S130, in which a channel structure can be formed in the channel hole. In some embodiments, the channel structure can include an epitaxial layer 7 on the bottom of channel hole 6, a functional layer 8 on the sidewall of the channel hole 5, and a filling structure 10 in channel hole 6, and a channel layer 9 between functional layer 8 and the filling structure 10. Functional layer 8 can include a barrier layer 801, a storage layer 803, and a tunneling layer 805.

Figure 2F:
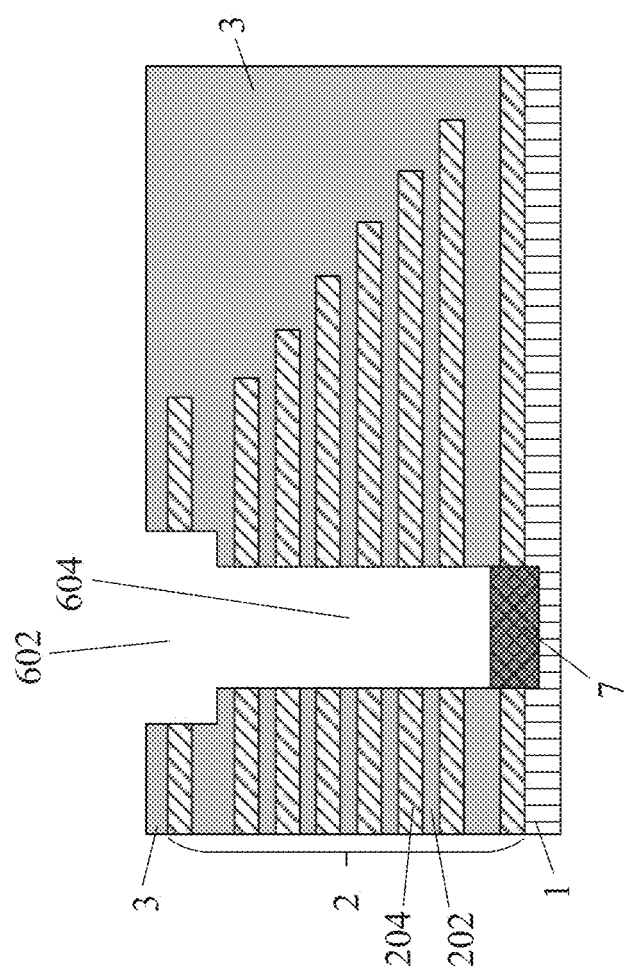

As shown in FIG. 2F, hard mask layer 4 can be removed. Epitaxial layer 7 can be formed on the bottom of the lower portion 604 of channel hole 6 and on substrate 1 that is exposed by channel hole 6. In some embodiments, epitaxial layer 7 can be a polycrystalline silicon (polysilicon) layer formed by using a selective epitaxial growth (SEG) process. In some embodiments, epitaxial layer 7 may not be directly formed on the surface of substrate 1. One or more layers can be formed between epitaxial layer 7 and substrate 1. That is, epitaxial layer 7 overlays substrate 1. A top surface of epitaxial layer 7 can be higher than a top surface of the bottom first dielectric layer 202, which is the isolation layer of the bottom selective gate (e.g., source selective gate).

Figure 2G:
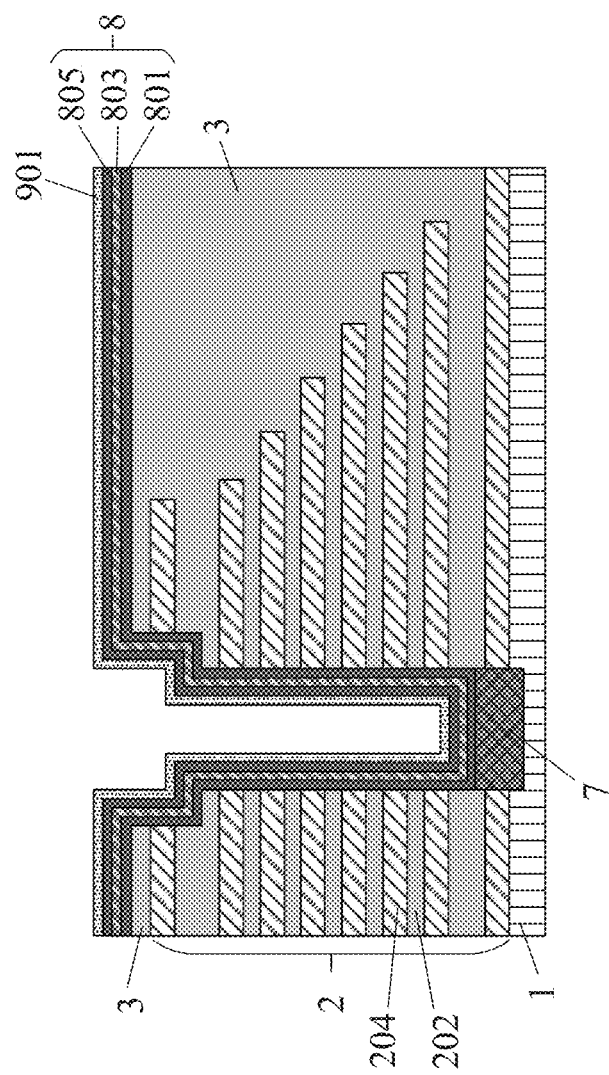

As shown in FIG. 2G, functional layer 8 including barrier layer 801, storage layer 803 and tunneling layer 805 can be formed on the sidewall of channel hole 6, on the bottom of channel hole 6, on the platform at the boundary between the upper portion 602 and the lower portion 604 of channel hole 6, and on the top surface of first insulating layer 3. In some embodiments, barrier layer 801, storage layer 803 and tunneling layer 805 can be formed by using any suitable deposition process, such as atomic layer deposition (ALD) processes.

Barrier layer 801 can be used for blocking the outflow of the electronic charges. In some embodiments, barrier layer 801 can be a silicon oxide layer or a combination of silicon oxide/silicon oxynitride/silicon oxide ($SiO_2$—$SiON$—$SiO_2$) layers. In some embodiments, barrier layer 801 includes high dielectric constant (high-k) dielectrics (e.g., aluminum oxide). In one example, barrier layer 801 is an oxide layer formed by In-Situ Steam Generation (ISSG) oxidation after a silicon nitride deposition process. In some embodiments, a thickness of barrier layer 801 can be less than 20 nm.

Storage layer 803, which is also referred as a charge trap layer, can be used for storing electronic charges. The storage and/or removal of charge in storage layer 803 can impact the on/off state and/or a conductance of the semiconductor channel. Storage layer 803 can include polycrystalline silicon (polysilicon) or silicon nitride. Storage layer 803 can include one or more films of materials including, but are not limited to, silicon nitride, silicon oxynitride, a combination of silicon oxide and silicon nitride, or any combination thereof. In some embodiments, storage layer 803 can include a nitride layer formed by using one or more deposition processes. In some embodiments, a thickness of storage layer 803 can be less than 20 nm.

Tunneling layer 805 can be used for tunneling electronic charges (electrons or holes). Tunneling layer 805 can include dielectric materials including, but not limited to, silicon oxide, silicon nitride, silicon oxynitride, or any combination thereof. In some embodiments, tunneling layer 805 can be an oxide layer formed by using a deposition process. In some embodiments, a thickness of tunneling layer 805 can be less than 20 nm.

As shown in FIG. 2G, a first channel layer 901 can be formed to cover functional layer 8. In some embodiments, first channel layer 901 can be an amorphous silicon layer or a polysilicon layer formed by using a thin film deposition process, such as a low pressure chemical vapor deposition (LPCVD) process, a plasma enhanced chemical vapor deposition (PECVD) process, or any other suitable processes. In some embodiments, a thickness of first channel layer 901 can be less than about 20 nm.

Figure 2H:
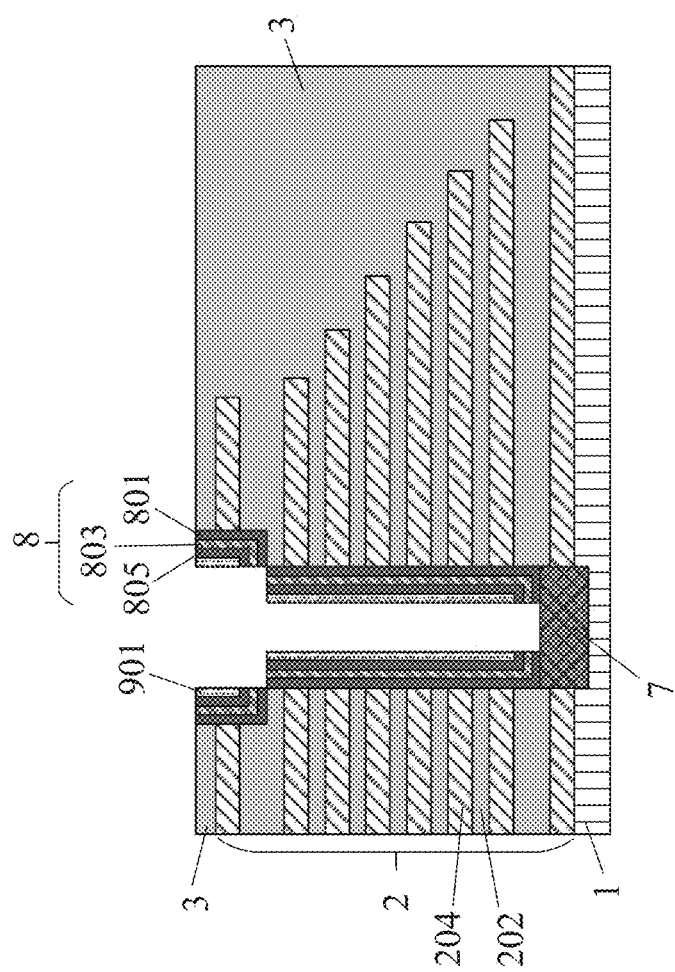

As shown in FIG. 2H, an etching process can be performed along the vertical direction to etch first channel layer 901 and functional layer 8, such that epitaxial layer 7 is exposed. Further, the portions of first channel layer 901 and functional layer 8 on the first insulating layer 3 is removed in the same etching process. In addition, the portions of first channel layer 901 and functional layer 8 in the upper portion 602 of channel hole 6 is separated from the portions of first channel layer 901 and functional layer 8 in the lower portion 604 of channel hole 6. In some embodiments, the etching process can be an anisotropic dry etching.

Figure 2I:
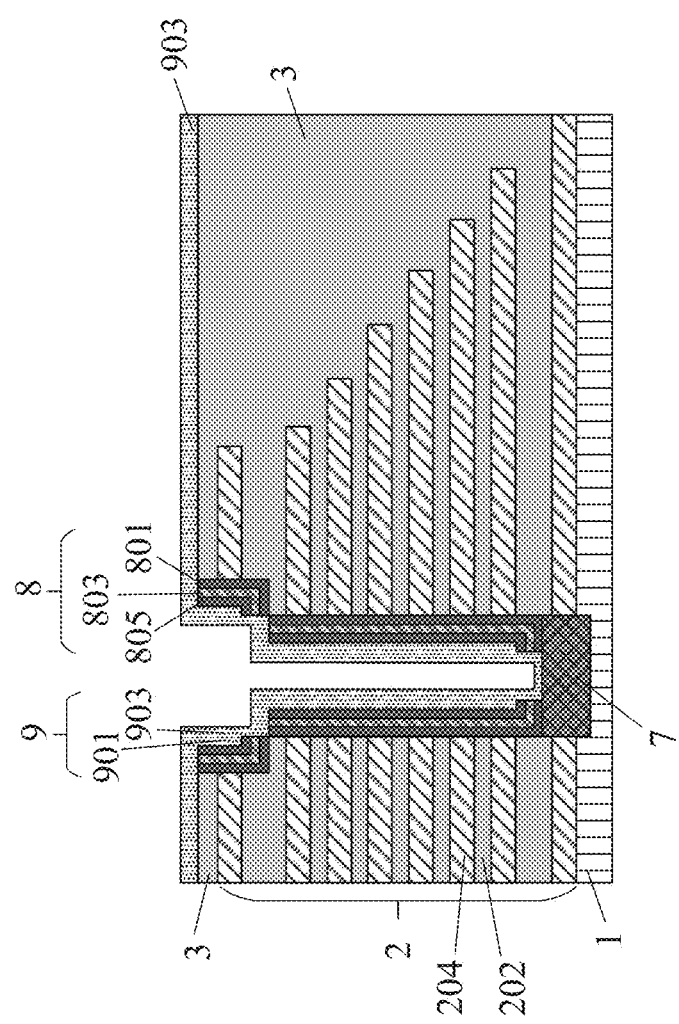

As shown in FIG. 2I, a second channel layer 903 can be formed to cover first channel layer 901, first insulating layer 3, and the exposed surfaces of epitaxial layer 7 and functional layer 8. In some embodiments, second channel layer 903 can be an amorphous silicon layer or a polysilicon layer formed by using a thin film deposition process, such as a low pressure chemical vapor deposition (LPCVD) process, a plasma enhanced chemical vapor deposition (PECVD) process, or any other suitable processes. In some embodiments, a thickness of second channel layer 903 can be less than about 20 nm. First channel layer 901 and second channel layer 903 can form channel layer 9. Channel layer 9 is electrically in contact with epitaxial layer 7.

Figure 2J:
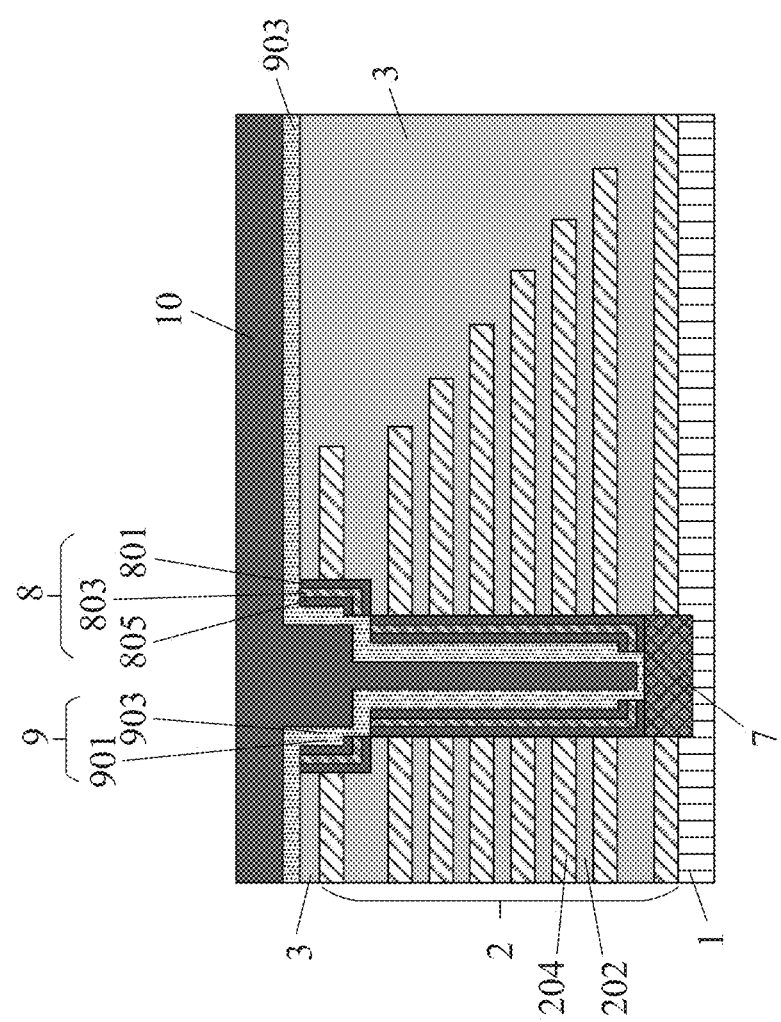

As shown in FIG. 2J, a filling structure 10 can be formed to cover channel layer 9 and fill channel hole 6. In some embodiments, filling structure 10 can be an oxide layer formed by using a deposition process, such as an atomic layer deposition (ALD) process. In some embodiments, filling structure 10 can include one or more airgaps (not shown). A chemical mechanical polishing (CMP) process can be performed to planarize the top surface of filling structure 10.

Referring back to FIG. 1, the method can proceed to operation S140, in which an electrode plug can be formed in the upper portion of the channel hole. In some embodiments, the fabricating process for forming the electrode plug can include the following processes.

Figure 2K:
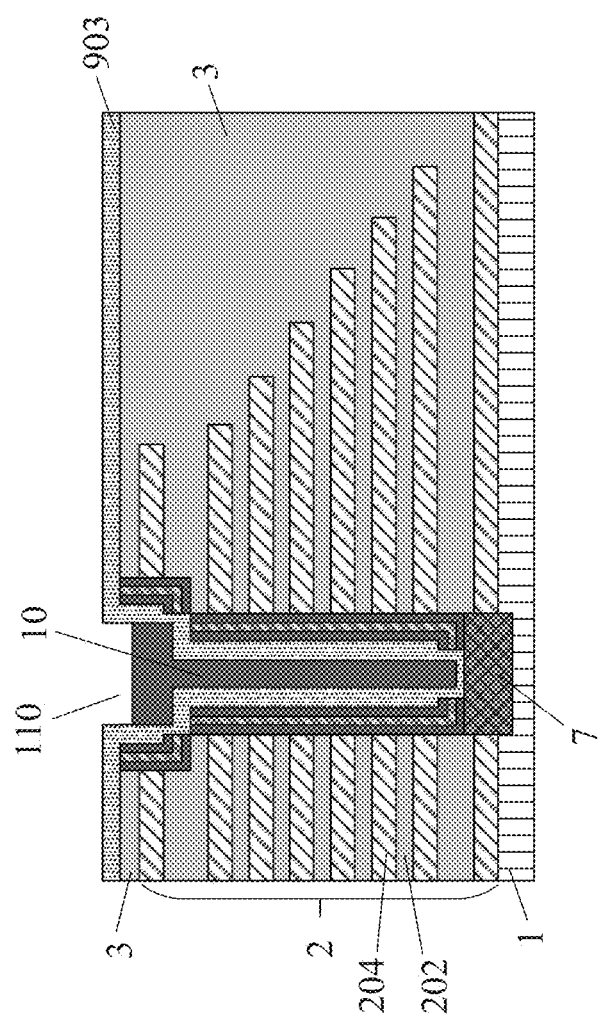

As shown in FIG. 2K, an upper portion of filling structure 10 can be removed to form a recess 110 in an upper portion 602 of channel hole 6. In some embodiments, a recess etching (which is also referred to "etch back") process can be performed to remove the upper portion of filling structure 10, such that the top surface of the remaining portion of the filling structure 10 is lower than the top surface of first insulating layer 3 but not lower than the bottom surface of first insulating layer 3 for improved device performance. In some embodiments, the recess etching process can includes, but not limited to, a chemical mechanical polishing (CMP), a wet etching, a dry etching, or a combination thereof. For example, a non-selective dry etching process can be performed to remove the upper portion of filling structure 10. As such, a recess 110 can be formed in the upper portion 602 of channel hole 6 and above the remaining portion of filling structure 10. A following dilute hydrofluoric acid (HF) cleaning process can be performed to clean the sidewall and bottom of recess 110. The sidewall of recess 110 is channel layer 9 and the bottom of recess 110 is filling structure 10.

Figure 2L:
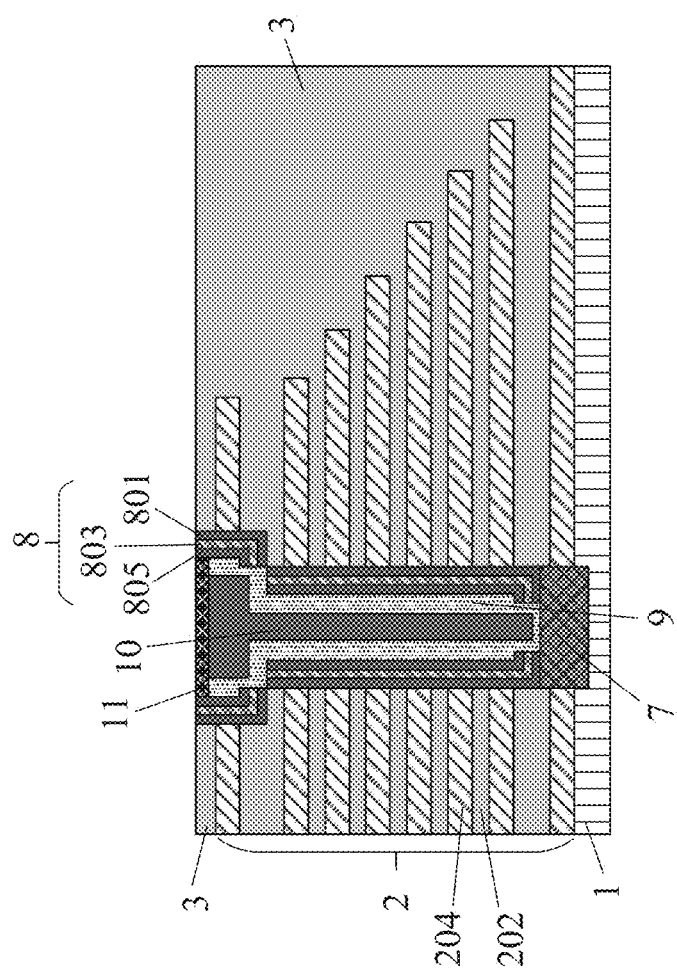

As shown in FIG. 2L, an electrode plug 11 can be formed in recess 110. In some embodiments, an electrode layer can be formed to cover channel layer 9 and to fill recess 110 that is above filling structure 10. The electrode layer can be an amorphous silicon layer or a polysilicon layer formed by using a thin film deposition process, such as a low pressure chemical vapor deposition (LPCVD) process, a plasma enhanced chemical vapor deposition (PECVD) process, or any other suitable processes. The electrode layer is in contact with channel layer 9 at the bottom of recess 110. The top surface of the formed structure can be planarized by any suitable techniques, such as backside grinding, and/or chemical mechanical polishing (CMP). As such, an upper portion electrode layer and channel layer 9 outside channel hole 6 can be removed, as shown in FIG. 2L.

An ion implantation process can be performed to the surface of the remaining portion of electrode layer in recess 110 to form electrode plug 11. A top surface of electrode plug 11 can be co-planer with the top surface of first insulating layer 3. In some embodiments without limiting the scope of the present disclosure, a thickness of electrode plug 11 in the vertical direction can be in a range between 30 nm and 100 nm, and a diameter of electrode plug 11 in the lateral direction can be equal to the second diameter of the lower portion 604 of channel hole 6, which is in a range between 30 nm and 80 nm. In some embodiments, electrode plug 11 can be used as a drain electrode of a metal-oxide-semiconductor field-effect transistor (MOSFET) formed in subsequent processes.

Figure 2M:
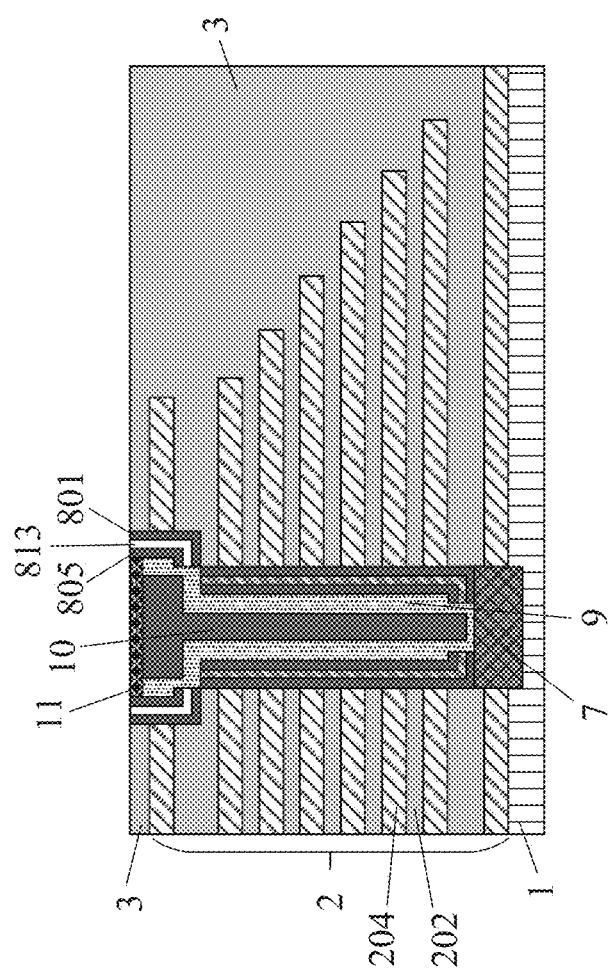
Figure 2N:
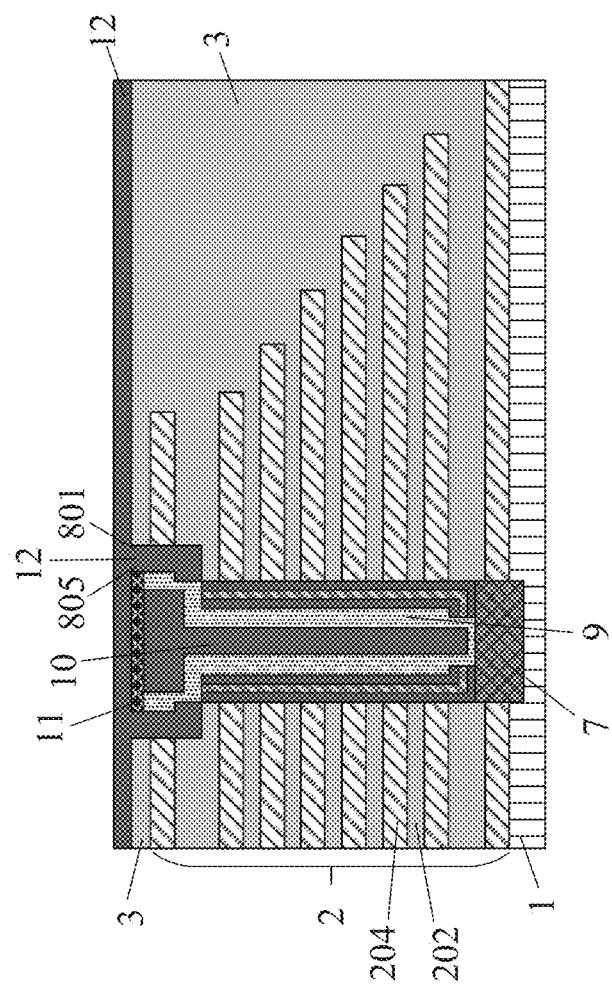
Figure 20:
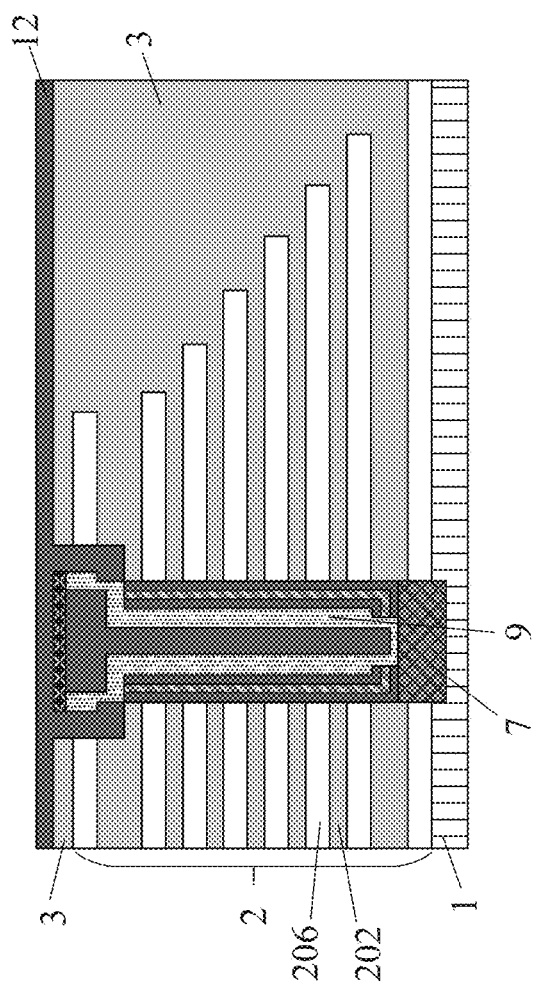
Figure 2P:
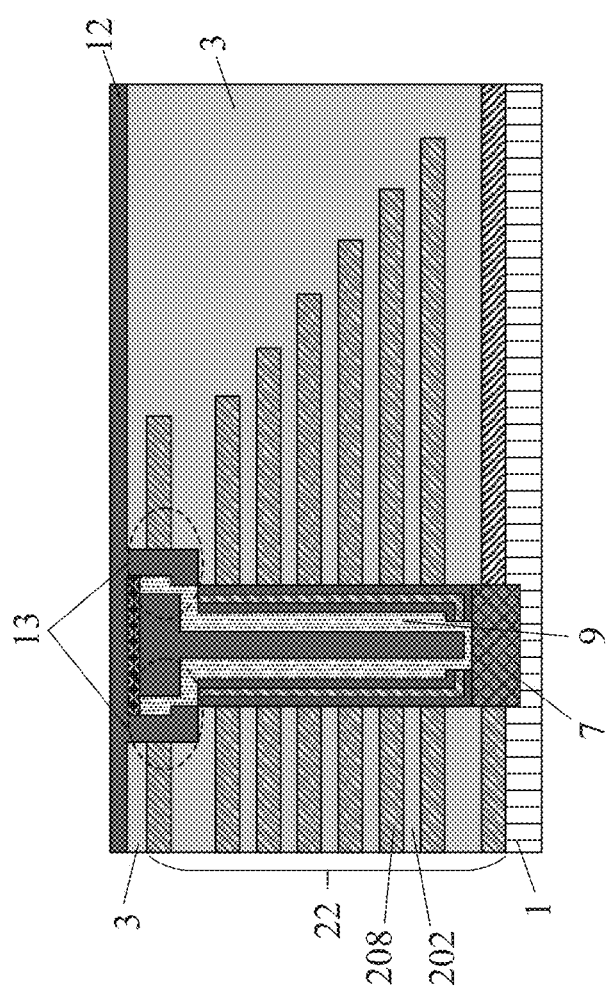

Referring back to FIG. 1, the method can proceed to operation S150, in which the storage layer in the functional layer in the upper portion of the channel hole can be replaced with a second insulating layer. In some embodiments, a selective wet etching process can be performed to remove storage layer 803 of functional layer 8 in the upper portion 602 of channel hole 6. As shown in FIG. 2M, a hollow space 813 can be formed between barrier layer 801 and tunneling layer 805 of functional layer 8 in the upper portion 602 of channel hole 6. As shown in FIG. 2N, a deposition process can be performed to form a second insulating layer 12 to fill hollow space 813 and cover the top surfaces of first insulating layer 3 and drain electrode structure 11. In some embodiments, second insulating layer 12 can include any suitable insulating material and/or dielectric material, such as silicon oxide. A top surface of second insulating layer 12 can be planarized.

Referring back to FIG. 1, the method can proceed to operation S160, in which the multiple second dielectric layers in the alternating dielectric stack can be replaced with multiple conductive layers. In some embodiments, a gate replacement process (also known as the "word line replacement" process) can be performed to replace second dielectric layers 204 (e.g., silicon nitride) of alternating dielectric stack 2 with conductive layers (e.g., W).

As shown in FIG. 2O, second dielectric layers 204 in the alternating dielectric stack 2 can be removed to form multiple trenches 206. It is noted that, second dielectric layers 204 in the alternating dielectric stack 2 are used as sacrificial layers, and are removed by used any suitable etching process, e.g., an isotropic dry etching or a wet etching. The etching process can have sufficiently high etching selectivity of the material of second dielectric layers 204 over the materials of first dielectric layers 202, such that the etching process can have minimal impact on first dielectric layers 202. The isotropic dry etch and/or the wet etch can remove second dielectric layers 204 in various directions to expose the top and bottom surfaces of each first dielectric layer 202. As such, multiple trenches 206 can then be formed between first dielectric layers 202.

In some embodiments, second dielectric layers 204 include silicon nitride, and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10V. In some embodiments, second dielectric layers 204 include silicon nitride and the etchant of the wet etch includes phosphoric acid.

After removing second dielectric layers 204, multiple trenches 206 can be cleaned by using any suitable cleaning process. For example, a phosphoric acid rinsing process can be performed to remove the impurities on the inner surfaces of multiple trenches 206. In some embodiments, a rinsing temperature can be in a range from about 100° C. to about 200° C., and a rinsing time can be in a range from about 10 minutes to about 100 minutes. After the cleaning process, the top and bottom surfaces of first dielectric layers 202, and the sidewalls of the channel structure can be exposed through multiple trenches 206.

As shown in FIG. 2P, a conductive layer 208 can be formed in each of multiple trenches 206 by filling multiple trenches 206 with a suitable gate electrode metal material. The conductive layers 208 can provide the base material for the subsequently-formed word lines (e.g., gate electrodes). The gate electrode metal material can include any suitable conductive material, e.g., tungsten, aluminum, copper, cobalt, or any combination thereof, for forming the word lines (e.g., gate electrodes). The gate electrode material can be deposited into multiple trenches 206 using a suitable deposition method such as CVD, physical vapor deposition (PVD), plasma-enhanced CVD (PECVD), sputtering, metalorganic chemical vapor deposition (MOCVD), and/or ALD. In some embodiments, conductive layers 208 include tungsten formed by CVD. As a result, after the gate replacement process, the alternating dielectric stack 2 can become an alternating conductive/dielectric stack 22.

In some embodiments, before forming conductive layers 208, an third insulating layer (not shown in the figures) can be formed to cover the exposed surface by multiple trenches 206. For example, one or more suitable deposition processes, such as CVD, PVD, and/or ALD, can be utilized to deposit one or more insulating materials including, but not limited to, silicon oxide, silicon nitride, silicon oxynitride, aluminum oxide, titanium nitride, etc., and/or any suitable combinations thereof, into multiple trenches 206. In some alternative embodiments, before forming conductive layers 208, an oxidation process can be performed to treat the exposed surface by multiple trenches 206, such that the sidewalls of the channel structure can be oxidized. Thus, the subsequently formed conductive layers 208 can be insulated from epitaxial layer 7 and barrier layer 801 in the channel structure.

Accordingly, the 3D memory device fabricated by the disclosed method described above is shown in FIG. 2P. The 3D memory device comprises an alternating layer stack on a substrate, a first insulating layer covering the alternating layer stack, and a channel hole penetrating the first insulating layer and the alternating layer stack. The alternating layer stack includes at least 32 conductive/dielectric layer pairs stacked in a vertical direction. Each conductive/dielectric pair includes a dielectric layer and a conductive layer.

In some embodiments, the channel hole include a lower portion and an upper portion. A first diameter of a lower portion of the channel hole is smaller than a second diameter of an upper portion of the channel hole. The first diameter is in a range from about 30 nm to 80 nm, and the second diameter is in a range from about 60 nm to 150 nm.

In the lower portion of the channel hole, a channel structure includes an epitaxial layer on a bottom of the channel hole, a functional layer on a sidewall of the lower portion of the channel hole, a channel layer covering the functional layer and being in contact with the epitaxial layer, and a filling structure covering a sidewall of the channel layer and filling the channel hole. The functional layer can include a barrier layer, a storage layer, and a tunneling layer.

In the upper portion of the channel hole, a second insulating layer is between the barrier layer and the tunneling layer. An electrode plug above the filling structure is in contact with the channel layer. It is noted that, the electrode plug and the channel layer is made of semiconductor material (e.g., polysilicon). The second insulating layer, the barrier layer, and the tunneling layer are made of oxide material (e.g., silicon oxide). The top conductive layer of the alternating layer stack is made of a metal material (e.g., tungsten). Thus, the upper portion of the formed 3D memory device is a metal-oxide-semiconductor (MOS) transistor 13, which can be used as a top selective gate (e.g., drain selective transistor).

Therefore, the disclosed method for forming a 3D NAND memory device can provide a MOS transistor as the top selective gate structure for a memory array. When forming the vertical memory cell strings, the storage layer (e.g., silicon nitride layer) corresponding to the top memory layer can be replaced with a silicon oxide layer. The silicon oxide layer can be used as a gate oxide layer, and does not affect the memory cell layers below the top memory layer. The formed MOS transistor can serve as a drain selective transistor for the 3D NAND memory device.

Comparing to the existing 3D NAND memory devices, the 3D NAND memory device formed by the disclosed method does not have a storage layer in the gate oxide layer in the drain selective gate. Thus, in the operation of the 3D NAND memory device, the drain selective gate does not store or release charges. Thus, the problem of vertical channel leakage can be eliminated, and thereby reducing the risk of memory read failure and prolonging the memory life. Moreover, using MOS transistors as the drain selective gates can have better switching characteristics.

Accordingly, one aspect of the present disclosure provides a method for forming a three-dimensional (3D) memory device, comprising: forming an alternating dielectric stack and a first insulating layer on a substrate, the alternating dielectric stack including a plurality of first dielectric layers and second dielectric layers; forming a channel hole penetrating the first insulating layer and the alternating dielectric stack, a first diameter of a lower portion of the channel hole being smaller than a second diameter of an upper portion of the channel hole; forming a channel structure including a functional layer in the channel hole, the functional layer including a storage layer; forming an electrode plug in the upper portion of the channel hole; replacing the storage layer in the functional layer in the upper portion of the channel hole with a second insulating layer; and replacing the plurality of second dielectric layers in the alternating dielectric stack with a plurality of conductive layers.

In some embodiments, forming the alternating dielectric stack comprises: forming at least 32 dielectric layer pairs stacked in a vertical direction, wherein each dielectric layer pair includes one first dielectric layer and one second dielectric layer that is different from the first dielectric layer. In some embodiments, forming the alternating dielectric stack comprises: forming at least 32 dielectric layer pairs stacked in the vertical direction, wherein each dielectric layer pair includes a silicon oxide layer and a silicon nitride layer.

In some embodiments, forming the channel hole comprises: forming the channel hole penetrating the first insulating layer and the alternating dielectric stack, the channel hole having the first diameter; and enlarging the upper portion of the channel hole, such that the upper portion of the channel hole has the second diameter. A difference between the second diameter and the first diameter is larger than a thickness of the functional layer.

In some embodiments, enlarging the upper portion of the channel hole comprises: adjusting an opening of a hard mask layer; and etching the alternating dielectric stack based on the opening to enlarge the upper portion of the channel hole. The upper portion of the channel hole at least includes a top second dielectric layer and a portion of a top first dielectric layer of the alternating dielectric stack.

In some embodiments, forming the channel structure comprises: forming an epitaxial layer on a bottom of the channel hole; forming the functional layer on a sidewall of the channel hole and on a platform at a boundary between the upper portion and the lower portion of the channel hole; forming a channel layer covering the functional layer, the channel layer being in contact with the epitaxial layer; and forming a filling structure covering a sidewall of the channel layer and filling the channel hole.

In some embodiments, forming the functional layer comprises: forming a barrier layer on the sidewall of the channel hole to block an outflow of electronic charges; forming the storage layer on a surface of the first barrier layer to store electronic charges during operation of the 3D memory device; and forming a tunneling layer on a surface of the storage layer to tunnel electronic charges.

In some embodiments, forming the channel layer comprises: forming a first channel layer covering the functional layer; removing a portion of the first channel and the functional layer to expose a surface of the epitaxial layer, and to separate the functional layer in the lower portion of the channel hole with the functional layer in the upper portion of the channel hole; and forming a second channel layer covering the first channel layer and the exposed surface of the epitaxial layer.

In some embodiments, forming the electrode plug comprises: removing an upper portion of the filling structure to form a recess in the upper portion of the first channel hole; forming the electrode plug in the recess; and performing an implantation process to the electrode plug.

In some embodiments, replacing the storage layer in the functional layer in the upper portion of the channel hole with the second insulating layer comprises: removing the storage layer of the functional layer in the upper portion of the channel hole to form a hollow space between the barrier layer and the tunneling layer of the functional layer in the upper portion of channel hole; and depositing an insulating material to fill the hollow space.

In some embodiments, replacing the plurality of second dielectric layers in the alternating dielectric stack with the plurality of conductive layers comprises: removing the plurality of second dielectric layers in the alternating dielectric stack to form a plurality of trenches; and depositing a conductive material to fill the plurality of trenches to form the plurality of conductive layers.

In some embodiments, the method further comprises forming a staircase structure in the alternating dielectric stack, wherein the first insulating layer covers the staircase structure.

Another aspect of the present disclosure provides a three-dimensional (3D) memory device, comprising: an alternating layer stack on a substrate; a first insulating layer covering the alternating layer stack; a channel hole penetrating the first insulating layer and the alternating layer stack, a first diameter of a lower portion of the channel hole being smaller than a second diameter of an upper portion of the channel hole; a channel structure including a functional layer in the lower portion of the channel hole; and a top selective gate structure above the lower portion of the channel hole, including: an electrode plug in the upper portion of the channel hole, and a second insulating layer between the electrode plug and a top conductive layer of the alternating layer stack.

In some embodiments, the top selective gate structure is a metal-oxide-semiconductor transistor configured to function as a drain selective transistor.

In some embodiments, the alternating layer stack comprises at least 32 conductive/dielectric layer pairs stacked in a vertical direction, wherein each conductive/dielectric pair includes a dielectric layer and a conductive layer. In some embodiments, the alternating layer stack comprises at least 32 conductive/dielectric layer pairs stacked in a vertical direction, wherein each conductive/dielectric layer pair includes a silicon oxide layer and a tungsten layer.

In some embodiments, a difference between the second diameter and the first diameter is larger than a thickness of the functional layer.

In some embodiments, the channel structure comprises: an epitaxial layer on a bottom of the channel hole, a top surface of the epitaxial layer is higher than a top surface of a bottom conductive layer of the alternating layer stack; the functional layer on a sidewall of the lower portion of the channel hole; a channel layer covering the functional layer, the channel layer being in contact with the epitaxial layer; and a filling structure covering a sidewall of the channel layer and filling the channel hole.

In some embodiments, the functional layer comprises: a barrier layer on the sidewall of the lower portion of the channel hole configured to block an outflow of electronic charges; the storage layer on a surface of the barrier layer configured to store electronic charges during operation of the 3D memory device; and a tunneling layer on a surface of the storage layer configured to tunnel electronic charges.

In some embodiments, the device further comprises a staircase structure in the alternating dielectric stack. The first insulating layer covers the staircase structure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming an alternating dielectric stack and a first insulating layer on a substrate, the alternating dielectric stack comprising a plurality of first dielectric layers and second dielectric layers;
   forming a channel hole penetrating the first insulating layer and the alternating dielectric stack, a first diameter of a lower portion of the channel hole being smaller than a second diameter of an upper portion of the channel hole;
   forming a channel structure comprising a functional layer in the channel hole, the functional layer comprising a storage layer;
   forming an electrode plug in the upper portion of the channel hole;

replacing the storage layer in the functional layer in the upper portion of the channel hole with a second insulating layer; and replacing the plurality of second dielectric layers in the alternating dielectric stack with a plurality of conductive layers.

2. The method of claim 1, wherein forming the alternating dielectric stack comprises:

forming at least 32 dielectric layer pairs stacked in a vertical direction, wherein each dielectric layer pair comprises one first dielectric layer and one second dielectric layer that is different from the first dielectric layer.

3. The method of claim 2, wherein forming the alternating dielectric stack comprises:

forming at least 32 dielectric layer pairs stacked in the vertical direction, wherein each dielectric layer pair comprises a silicon oxide layer and a silicon nitride layer.

4. The method of claim 2, wherein forming the channel hole comprises:

forming the channel hole penetrating the first insulating layer and the alternating dielectric stack, the channel hole having the first diameter; and enlarging the upper portion of the channel hole, such that the upper portion of the channel hole has the second diameter;

wherein a difference between the second diameter and the first diameter is larger than a thickness of the functional layer.

5. The method of claim 4, wherein enlarging the upper portion of the channel hole comprises:

adjusting an opening of a hard mask layer; and etching the alternating dielectric stack based on the opening to enlarge the upper portion of the channel hole;

wherein the upper portion of the channel hole at least comprises a top second dielectric layer and a portion of a top first dielectric layer of the alternating dielectric stack.

6. The method of claim 5, wherein forming the channel structure comprises:

forming an epitaxial layer on a bottom of the channel hole;

forming the functional layer on a sidewall of the channel hole and on a platform at a boundary between the upper portion and the lower portion of the channel hole;

forming a channel layer covering the functional layer, the channel layer being in contact with the epitaxial layer; and forming a filling structure covering a sidewall of the channel layer and filling the channel hole.

7. The method of claim 6, wherein forming the functional layer comprises:

forming a barrier layer on the sidewall of the channel hole to block an outflow of electronic charges;

forming the storage layer on a surface of the first barrier layer to store electronic charges during operation of the 3D memory device; and forming a tunneling layer on a surface of the storage layer to tunnel electronic charges.

8. The method of claim 6, wherein forming the channel layer comprises:

forming a first channel layer covering the functional layer;

removing a portion of the first channel and the functional layer to expose a surface of the epitaxial layer, and to separate the functional layer in the lower portion of the channel hole with the functional layer in the upper portion of the channel hole; and forming a second channel layer covering the first channel layer and the exposed surface of the epitaxial layer.

9. The method of claim 6, wherein forming the electrode plug comprises:

removing an upper portion of the filling structure to form a recess in the upper portion of the first channel hole;

forming the electrode plug in the recess; and performing an implantation process to the electrode plug.

10. The method of claim 7, wherein replacing the storage layer in the functional layer in the upper portion of the channel hole with the second insulating layer comprises:

removing the storage layer of the functional layer in the upper portion of the channel hole to form a hollow space between the barrier layer and the tunneling layer of the functional layer in the upper portion of channel hole; and depositing an insulating material to fill the hollow space.

11. The method of claim 10, wherein replacing the plurality of second dielectric layers in the alternating dielectric stack with the plurality of conductive layers comprises:

removing the plurality of second dielectric layers in the alternating dielectric stack to form a plurality of trenches; and depositing a conductive material to fill the plurality of trenches to form the plurality of conductive layers.

12. The method of claim 1, further comprising:

forming a staircase structure in the alternating dielectric stack, wherein the first insulating layer covers the staircase structure.

13. A three-dimensional (3D) memory device, comprising:

an alternating layer stack on a substrate;

a first insulating layer covering the alternating layer stack;

a channel hole penetrating the first insulating layer and the alternating layer stack, a first diameter of a lower portion of the channel hole being smaller than a second diameter of an upper portion of the channel hole;

a channel structure comprising a functional layer in the lower portion of the channel hole; and a top selective gate structure above the lower portion of the channel hole, comprising:

an electrode plug in the upper portion of the channel hole, and a second insulating layer between the electrode plug and a top conductive layer of the alternating layer stack.

14. The device of claim 13, wherein:

the top selective gate structure is a metal-oxide-semiconductor transistor configured to function as a drain selective transistor.

15. The device of claim 13, wherein the alternating layer stack comprises:

at least 32 conductive/dielectric layer pairs stacked in a vertical direction, wherein each conductive/dielectric pair comprises a dielectric layer and a conductive layer.

16. The device of claim 13, wherein the alternating layer stack comprises:

at least 32 conductive/dielectric layer pairs stacked in a vertical direction, wherein each conductive/dielectric layer pair comprises a silicon oxide layer and a tungsten layer.

17. The device of claim 13, wherein:

a difference between the second diameter and the first diameter is larger than a thickness of the functional layer.

18. The device of claim 13, wherein the channel structure comprises:
- an epitaxial layer on a bottom of the channel hole, a top surface of the epitaxial layer is higher than a top surface of a bottom conductive layer of the alternating layer stack;
- the functional layer on a sidewall of the lower portion of the channel hole;
- a channel layer covering the functional layer, the channel layer being in contact with the epitaxial layer; and
- a filling structure covering a sidewall of the channel layer and filling the channel hole.

19. The device of claim 18, wherein the functional layer comprises:
- a barrier layer on the sidewall of the lower portion of the channel hole configured to block an outflow of electronic charges;
- the storage layer on a surface of the barrier layer configured to store electronic charges during operation of the 3D memory device; and
- a tunneling layer on a surface of the storage layer configured to tunnel electronic charges.

20. The device of claim 13, further comprising:
- a staircase structure in the alternating dielectric stack, wherein the first insulating layer covers the staircase structure.

* * * * *